(12) United States Patent
Ahn

(10) Patent No.: US 8,054,862 B2
(45) Date of Patent: Nov. 8, 2011

(54) OPTOELECTRONIC DEVICES

(75) Inventor: Doyeol Ahn, Seoul (KR)

(73) Assignee: University of Seoul Industry Cooperation Foundation (KR)

( * ) Notice: Subject to any disclaimer, the term of this patent is extended or adjusted under 35 U.S.C. 154(b) by 9 days.

(21) Appl. No.: 12/192,025

(22) Filed: Aug. 14, 2008

(65) Prior Publication Data
US 2010/0040102 A1    Feb. 18, 2010

(51) Int. Cl.
*H01S 5/00* (2006.01)
(52) U.S. Cl. ............................ 372/45.011; 372/45.01
(58) Field of Classification Search .......... 372/45.011, 372/43.01
See application file for complete search history.

(56) References Cited

U.S. PATENT DOCUMENTS
7,663,138 B2 * 2/2010 Fujikura ..................... 257/9
2002/0179923 A1 * 12/2002 Morita et al. ............... 257/103

OTHER PUBLICATIONS

Park et al., "Optical gain in InGaN/InGaAlN quantum well structures with zero internal field", Applied Physics Letters 92, 171115 (2008).

* cited by examiner

*Primary Examiner* — Kinam Park
(74) *Attorney, Agent, or Firm* — Cantor Colburn LLP

(57) ABSTRACT

Optoelectronic devices are provided. In one embodiment, a device may include a first conductivity type cladding layer including a first barrier layer, an active layer formed on the first conductivity-type cladding layer, the active layer including a well layer made of a nitride semiconductor, and a second conductivity-type cladding layer formed on the active layer and including a second barrier layer. The active layer is positioned between and adjacent to the first barrier layer and the second barrier layer.

11 Claims, 6 Drawing Sheets

OPTOELECTRONIC DEVICES

BACKGROUND

In recent years, optoelectronic devices, such as photovoltaic cells, light emitting diodes, and laser diodes, have generated a great deal of interest as an alternative source of energy, an illuminating element for display, or as a display element itself. The emissive characteristics of light emitting devices, for example, are known to be based on the mechanism of recombination, by which electrical energy is converted into photon energy. It is the recombination efficiency in the active (or quantum well) layer of the light emitting device that determines the internal quantum efficiency of the device.

Recent studies are being focused on light emitting devices having a nitride semiconductor such as indium gallium nitride (InGaN) in the active layer, which is found to exhibit full solar spectrum capability. In addition, Group III-V nitride based radiation resistant photovoltaic cells are being examined. However, the nitride material in the active layer tends to cause strong piezo effects on the electric field due to the difference in lattice constants between the active layer and the cladding (or barrier) layers. The piezo electric field, in turn, causes the wave functions of the electrons and holes in the active layer to separate from each other and decrease the recombination rate of the electrons and holes drastically, thereby degrading the adsorption coefficient and the efficiency of the device.

SUMMARY

Various embodiments of optoelectronic devices are disclosed herein. In one embodiment by way of non-limiting example, a device comprises a first conductivity type cladding layer including a first barrier layer, an active layer formed on the first conductivity-type cladding layer, the active layer including a well layer made of a nitride semiconductor, and a second conductivity-type cladding layer formed on the active layer and including a second barrier layer. The active layer is positioned between and adjacent to the first barrier layer and the second barrier layer.

In another embodiment, a device comprises a first conductivity type cladding layer, an active layer formed on the first conductivity-type cladding layer, the active layer including a well layer made of a nitride semiconductor, and a second conductivity type cladding layer formed on the active layer. The at least one of the first conductivity type cladding layer and the second conductivity type cladding layer includes a superlattice multilayer.

The Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

DETAILED DESCRIPTION

Figure 1:
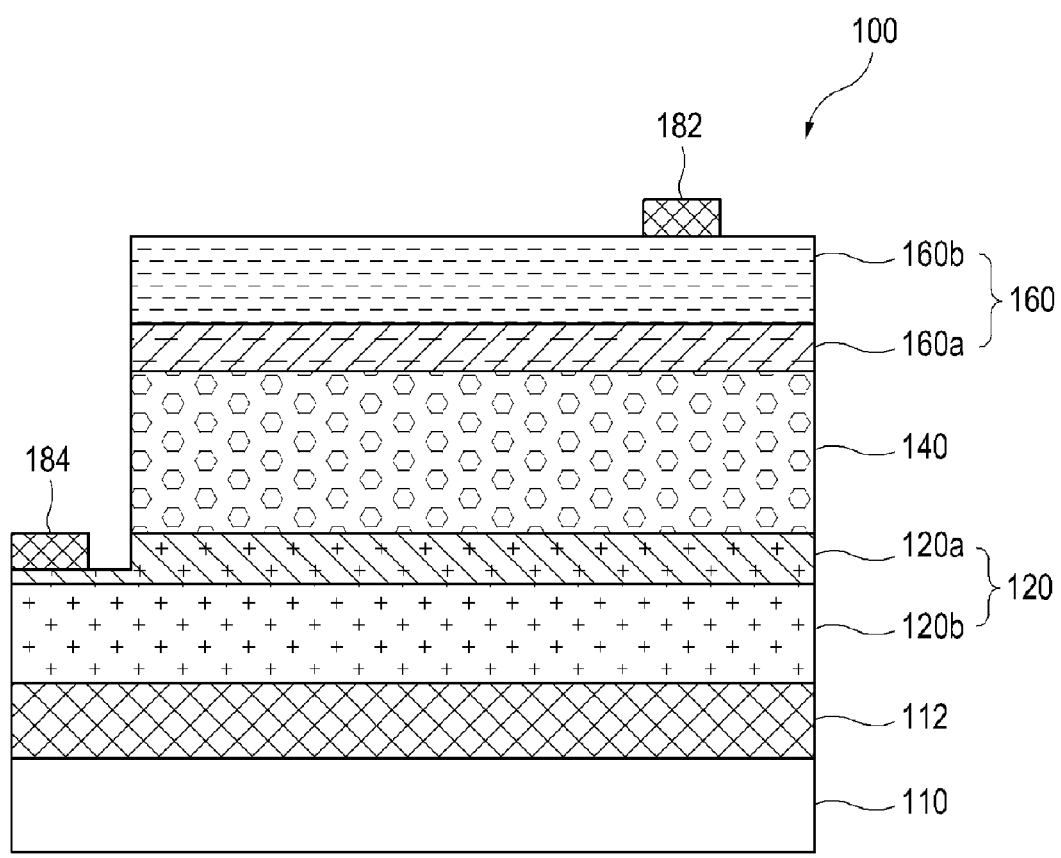
FIG. 1 is a schematic diagram showing an illustrative embodiment of an optoelectronic device.

In the following detailed description, reference is made to the accompanying drawings, which form a part hereof In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the components of the present disclosure, as generally described herein, and illustrated in the Figures, may be arranged, substituted, combined, and designed in a wide variety of different configurations, all of which are explicitly contemplated and make part of this disclosure.

FIG. 1 shows an illustrative embodiment of an optoelectronic device 100. As depicted, the optoelectronic device 100 may have a laminated structure in which a substrate 110, a buffer layer 112, a first conductivity type cladding layer 120, an active layer 140, and a second conductivity type cladding layer 160 are sequentially stacked. The substrate 110 may be formed from nitride semiconductor materials, such as gallium nitride (GaN), or other materials, such as sapphire ($Al_2O_3$), silicon carbide (SiC), silicon (Si), and gallium arsenide (GaAs). The buffer layer 112 may be formed to reduce the difference in lattice constants and heat expansion coefficients between the substrate 110 and the first conductivity type cladding layer 120. For example, if the substrate 110 is made from $Al_2O_3$, the buffer layer 112 may be formed from AlN, AlGaN, or SiC to grow a nitride semiconductor layer, such as InGaN, thereon. Alternatively, the buffer layer 112 is optional and may not be provided. For example, if the substrate 110 is made from a nitride semiconductor, the substrate 110 may adjoin the first conductivity type cladding layer 120 without any buffer layer present in between.

The active layer 140 may include a nitride based semiconductor. The nitride based semiconductor may include indium, gallium, and nitrogen or any other materials exhibiting the full-solar-spectrum characteristics and have a composition represented as $In_xGa_{1-x}N$ ($x \leq 1$). The indium concentration, x, in $In_xGa_{1-x}N$ may be changed depending on the usage of the optoelectronic device 100, e.g., a light emitting diode (LED), a laser diode (LD), etc. For example, x may be in the range of $0.34 \leq x \leq 0.47$ for a visible blue light emission application or $0 \leq x \leq 0.19$ for an ultraviolet light emission application. In general, x may be in the range of $0 \leq x \leq 0.3$ for a light emitting device.

The first conductivity type cladding layer 120 and second conductivity type cladding layer 160 may be a n-type or a p-type cladding layer, including indium, gallium, and nitrogen. The first conductivity type cladding layer 120 may include a first barrier layer 120a and a first subcladding layer 120b. The second conductivity type cladding layer 160 may include a second barrier layer 160a and a second subcladding layer 160b. The active layer 140 is positioned between the first barrier layer 120a and the second barrier layer 160a. In certain embodiments, the first barrier layer 120a and the second barrier layer 160a may include a material similar to that of the active layer 140 to reduce the lattice differences between the active layer 140 and the first and second conductivity type cladding layers 120, 160. For example, the first and second barrier layers 120a, 160a, may include indium, gallium, and nitrogen, and have a composition represented as $In_yGa_{1-y}N$ ($y \leq 1$), when the active layer 140 is formed of $In_xGa_{1-x}N$. The characteristics of the first and second barrier layers 120a, 160a and the first and second subcladding layers 120b, 160b, such as compositions and their respective concentrations and thickness, etc., may be determined such that the strain and/or electric (polarization) field in the active layer 140 due to the lattice mismatch may be cancelled or reduced, as will be further described below.

The first conductivity type cladding layer 120 may be doped with at least one n-type dopant selected from the group of Si, Ge, and Sn. The second conductivity type cladding layer 160 may be doped with at least one p-type dopant selected from the group of Zn, Mg, Ca, and Be.

As illustrated in FIG. 1, the optoelectronic device 100 may further include a second conductivity type electrode pad 182 on the second conductivity type cladding layer 160 and an first conductivity type electrode pad 184 on the first conductivity type cladding layer 120 so that a predetermined voltage to the optoelectronic device 100 may be applied. The second conductivity type electrode pad 182 may have a laminated structure of Ni/Au or Ag/Au. The first conductivity type electrode pad 184 may have a laminated structure of Ti/Al. While FIG. 1 illustrates an embodiment where a part of the active layer 140 and the second conductivity cladding layer 160 has been removed to expose a part of the first conductivity type cladding layer 120 to form the first conductivity type electrode pad 184 thereon, various other embodiments are possible. For example, the substrate 110 and the buffer layer 112 may be removed and a first conductivity type electrode pad 184 may be formed beneath the first conductivity type cladding layer 120.

The respective layers may be formed by any one of a number of suitable methods, such as e-beam evaporation, physical vapor deposition (PVD), chemical vapor deposition (CVD), plasma laser deposition (PLD), dual-type thermal evaporation, sputtering, and so on.

A series of equations have been derived below to generally describe the polarization field and strain in the i-th layer of a laminated structure having multiple layers.

The total polarization field $P_t$ is provided as a sum of the spontaneous polarization $P_{sp}$ and the piezo field $P_z$, due to the strain in the layer caused by the lattice mismatch, as shown in Equation 1 below:

$$P_t = P_{sp} + P_z \quad \text{[Equation 1]}$$

where the spontaneous polarization $P_{sp}$ may be obtained by using experimental values known in the art, as described in Bernardini and Fiorentini, "Nonlinear Macroscopic Polarization in III-V Nitride Alloys," Physical Review B, 64:085207 (2001). The piezo electric fields of the i-th layer $P_{zi}$ may be calculated using Equation 2 below:

$$P_{zi} = 2d_{31}\left(c_{11} + c_{12} - \frac{2c_{13}^2}{c_{33}}\right)\varepsilon_{xxi} \quad \text{[Equation 2]}$$

where $d_{31}$ is a piezoelectric constant, $c_{11}$, $c_{12}$, $c_{13}$, and $c_{33}$ are elastic stiffness constants, and $\varepsilon_{xxi}$ is the effective strain in the i-th layer that may be represented by Equation 3 below:

$$\varepsilon_{xxi} = \frac{F_i}{E_i d_i} + \frac{d_i}{2R} \quad \text{[Equation 3]}$$

where $d_i$ is the thickness of the i-th layer, $E_i$ is the Young's modulus of the i-th layer, R may be represented by Equation 4 below and $F_i$ is the force per unit length of the i-th layer that may be represented by Equation 5 below:

$$\frac{1}{R} = \frac{R_3}{R_1 + R_2} \quad \text{[Equation 4]}$$

where $$R_1 = \left(\sum_i E_i d_i^3\right);$$

$$R_2 = 3\sum_i \frac{E_i d_i}{a_i}\left(d_i + 2\sum_{j<i} d_j\right) \times \left[\begin{array}{c} \sum_j\left(\frac{E_j d_j}{a_j}\right) \\ \left\{2\sum_{k<i} a_k d_k - 2\sum_{k<j} a_k d_k + \right. \\ \left. a_i d_i - a_j d_j \right\} \end{array}\right]$$

$$R_3 = 6\sum_i \frac{E_i d_i}{a_i}\left(d_i + 2\sum_{j<i} d_j\right)\left(\sum_j\left(\frac{E_j d_j}{a_j}\right)(l_i - l_j)\right)$$

$$F_i = \frac{E_i d_i}{a_i \sum_j (E_j d_j / a_j)} \times \left[\begin{array}{c} \frac{1}{R}\sum_j\left(\frac{E_j d_j}{a_j}\right) \\ \left\{\sum_{k<i} a_k d_k - \sum_{k<j} a_k d_k + \right. \\ \left. \frac{a_i d_i - a_j d_j}{2}\right\} + \\ \sum_j\left(\frac{E_j d_j}{a_j}\right)(l_j - l_i) \end{array}\right] \quad \text{[Equation 5]}$$

where $l_i = a_i(1 + a_i T)$, where $a_i$ is a lattice constant, $\alpha_i$ is a heat expansion constant, and T is the absolute temperature.

As can be seen from the above equations, the coefficients and/or the constants in the equations relate to the materials and concentrations of the layer of interest and layers adjacent thereto. For example, the strain and polarization field in the active layer 140 having a composition of $In_xGa_{1-x}N$ are related to the indium concentrations, x and y of $In_yGa_{1-y}N$ in the first and second conductivity type cladding layers 120, 160.

The changes in the strain and the polarization field in the active layer 140 and the first and second conductivity type cladding layers 120, 160, when the indium concentrations of the first and second barrier layers 120a, 160a are varied, may be calculated. In obtaining the strain and polarization field in the first and second conductivity type cladding layers 120, 160, and the active layer 140, it is assumed that the active layer 140 has a composition of $In_{0.2}Ga_{0.8}N$ and the first and second conductivity type cladding layers 120b, 160b, have GaN. It is also assumed that each of the first and second barrier layers 120a, 160a, has a thickness of 4 nm. The thickness of the barrier layers, however, may be changed as needed, e.g., from about 2 nm to about 6 nm, depending on the application. Table 1 below shows the results of the calculation for three different compositions, GaN, $In_{0.025}Ga_{0.975}N$, and $In_{0.05}Ga_{0.95}N$, of the first and second barrier layers 120a, 160a.

TABLE 1

| Indium concentration y (%) | 0 | 2.5 | 5 |
|---|---|---|---|
| Strain in active layer (%) | −2.09 | −2.035 | −1.984 |
| Strain in cladding layer (%) | 0.14 | −0.09 | −0.321 |
| Polarization field in active layer (MV/cm) | 3.01 | 2.909 | 2.83 |
| Polarization field in cladding layer (MV/cm) | −0.22 | 0.19 | 0.58 |

As indicated in Table 1 above, the active layer 140 in a structure where y=0% has a strain of −2.09% and a polarization field of 3.01 MV/cm. When y=2.5% and 5%, the active layer 140 has strains of −2.035% and −1.984% and polarization fields of 2.909 MV/cm and 2.83 MV/cm, respectively. These results may indicate that the active layer 140 has a strain reduced by 2.63%-5.07% and polarization field reduced by 3.36%-5.98% compared to the structure without the first and second barrier layers 120a, 160a. That is, as the indium concentrations of the first and second barrier layers 120a, 160a, increase, the strain and the polarization field in the active layer 140 may decrease. Accordingly, increasing the indium concentration in the first and second barrier layers in a structure with an active layer including indium may reduce the strain and/or polarization field in the active layer. Since indium is relatively rare and costly, however, a tradeoff may be made between the performance and the associated costs. For example, in order to yield a reasonably good performance, the indium concentration, y, in the first and second barrier layers 120a, 160a having a composition of $In_yGa_{1-y}N$ may have a range of $0 \leq y \leq 0.3$, when the active layer 140 has a composition of $In_xGa_{1-x}N$ where $0 \leq x \leq 0.3$.

The strain and polarization field in the active layer 140 and first and second conductivity type cladding layers 120, 160, may also be calculated, as the thicknesses of the first and second barrier layers 120a, 160a, are varied. In obtaining the strain and polarization field in the first and second conductivity type cladding layers 120, 160, and the active layer 140, it is assumed that the active layer 140, the first and second barrier layers 120a, 160a, and the first and second subcladding layers 120b, 160b, have compositions of $In_{0.2}Ga_{0.8}N$, $In_{0.025}Ga_{0.975}N$, and GaN, respectively. Table 2 below shows the results of the calculation for the first and second barrier layers 120a, 160a, having thicknesses of 2 nm, 4 nm, and 6 nm.

TABLE 2

| Thickness (nm) | 2 | 4 | 6 |
|---|---|---|---|
| Strain in active layer (%) | −2.06 | −2.035 | −2.001 |
| Strain in cladding layers (%) | −0.117 | −0.09 | −0.06 |
| Polarization field in active layer (MV/cm) | 2.946 | 2.909 | 2.87 |
| Polarization field in cladding layers (MV/cm) | 0.237 | 0.19 | 0.142 |

As indicated in Table 2 above, the active layer 140 in a structure with first and second barrier layers 120a, 160a, having thicknesses of 2 nm, 4 nm, and 6 nm has strains of −2.06%, −2.035%, and −2.001%, respectively, and polarization fields of −0.117, −0.09, and −0.06 MV/cm, respectively. These results may show that the strain and polarization field in the active layer 140 decrease, as the thicknesses of the first and second barrier layers 120a, 160a, increase. Accordingly, increasing the thickness of the first and second barrier layers may reduce the strain and/or polarization field in the active layer. Due to the size limit, however, a tradeoff may be made between the performance and associated size. For example, in order to yield a reasonably good performance, the thickness of the first and second barrier layers 120a, 160a, may be about 6 nm or less, when the thickness of the active layer 140 is about 3 nm or less.

Tables 1 and 2 above merely represent certain illustrative embodiments where the concentrations and the thicknesses of the first and second barrier layers 120a, 160a, may be varied, but are not to be considered limiting the scope of the disclosure. The materials constituting the first and second barrier layers 120a, 160a may also be changed. Further, the concentrations, thicknesses, and the materials for the first and second conductivity type cladding layers 120b, 160b, may also be changed to depolarize the built-in electric fields in the active layer 140, similar to the first and second barrier layers 120a, 160a. The first and second barrier layers 120a, 160a, may be configured to be directly adjacent to the active layer 140 so that they have a larger effect on the strain and piezo field in the active layer 140 than do the first and second conductivity type cladding layers 120b, 160b. Thus, the first and second barrier layers 120a, 160a, may be formed first on the active layer 140, followed by the first and second conductivity type cladding layers 120b, 160b.

As mentioned above, each layer 120a, 120b, 160a, 160b in the first and second conductivity type cladding layers 120, 160, may be adjusted in terms of thickness, materials, concentrations, etc. in order to cancel or reduce the strain and/or piezo field in the active layer 140 of the optoelectronic device 100. Therefore, the optoelectronic device in accordance with any of the above described embodiments may have an improved light emitting efficiency due to the increased recombination rate in the active layer.

Figure 2:
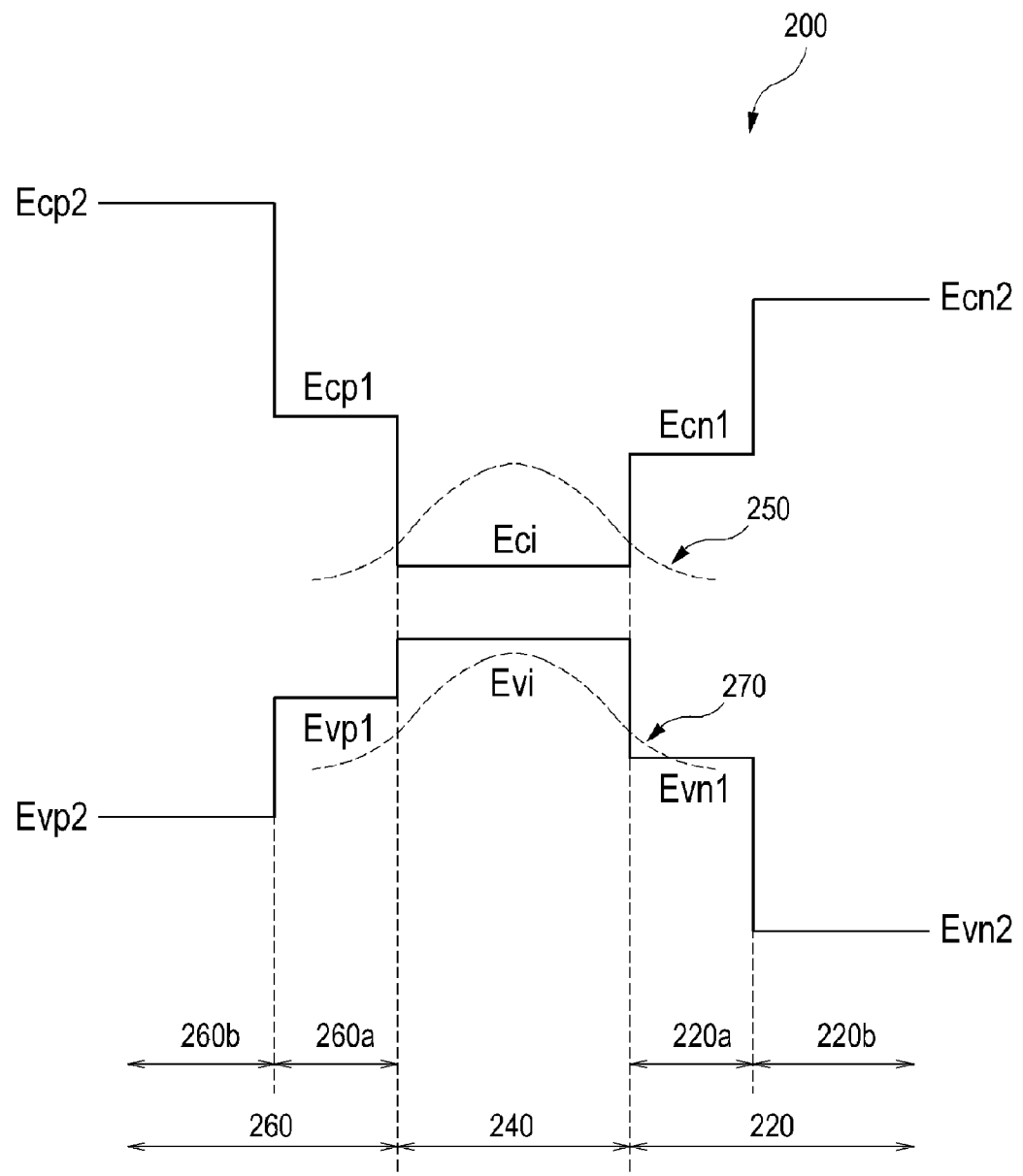
FIG. 2 is an energy band diagram showing carrier wave functions for the illustrative optoelectronic device shown in FIG. 1.

FIG. 2 is an energy band diagram 200 showing carrier wave functions 250, 270, for the illustrative optoelectronic device shown in FIG. 1. Reference numerals 220, 240, 260 in FIG. 2 represent the regions of the first conductivity type cladding layer, the active layer, and the second conductivity type cladding layer, respectively. Reference numerals 220a, 220b, 260a, 260b, represent regions of the first barrier layer, the first conductivity type cladding layer, the second barrier layer, and the second conductivity type cladding layer, respectively. In certain embodiments, the first and second conductivity type cladding layers 220, 260, may display step shaped energy bands, as illustrated in FIG. 2. FIG. 2 shows an illustrative embodiment only and is not intended to be limiting in any way. For example, an energy band may have a transitional region between the first and second barrier layers 220a, 260a and the first and second conductivity type cladding layers 220b, 260b.

The valence band energy upper limits Evp2 and Evp1 of the second conductivity type cladding layer 260 is lower than the valence band energy upper limit Evi of the active layer 240 so that the holes in the second conductivity type cladding layer 260 are diffused to the active layer 240. The holes in the active layer 240 are not diffused to the first conductivity type cladding layer 220 since the valence band energy upper limit Evi is higher than the valence band energy upper limits Evn1 and Evn2 of the first conductivity type cladding layer 220. Similarly, the electrons in the first conductivity type cladding layer 220 are diffused to the active layer 240, while the electrons in the active layer 240 are not diffused to the second conductivity type cladding layer 260 due to the level of the conduction band energy lower limits Ecp2, Ecp1, Eci, Ecn1, and Ecn2 in the second conductivity type cladding layer 260, the active layer 240, and the first conductivity type cladding layer 220. Thus, the electrons and the holes in the active layer 240 may be recombined to emit light in the case of a light emitting device.

The carrier wave functions 250, 270, which represent the probability of the existence of electrons and holes, respectively, may be located over near the center of the active layer 240 and overlap at their maximum portions, as shown in FIG. 2. Without the first and second barrier layers 220a, 260a, however, there would be a considerable built-in electric field in the active layer 240. That is because the lattice mismatch between the cladding layers 220, 260, and the active layer 240 causes piezo effects, which in turn cause the carrier wave functions 250, 270, to shift in the opposite directions. Specifically, the electron wave function 250 may be shifted in the direction of the electric field, while the hole wave function 270 may be shifted in the opposite direction of the electric field. As a result, the overlapping region of the carrier wave functions 250, 270, decreases, thereby reducing the light emitting efficiency.

As illustrated in FIG. 2, the second barrier layer 260a may be adjusted to reduce the difference in lattice constants between the active layer 240 and the second conductivity type cladding layer 260, so that the valence band energy upper limits Evp2, Evp1, and Evi satisfy the following relationship: $E_{vp2} < E_{vp1} < E_{vi}$. In this fashion, the strain and/or polarization field in the active layer 240 may be cancelled or reduced. Similarly, the strain and/or polarization field in the active layer 240 may be cancelled or reduced by a similar adjustment in the first barrier layer 220a. In one embodiment, the built-in electric field in the active layer 240 may be considerably reduced.

Figure 3:
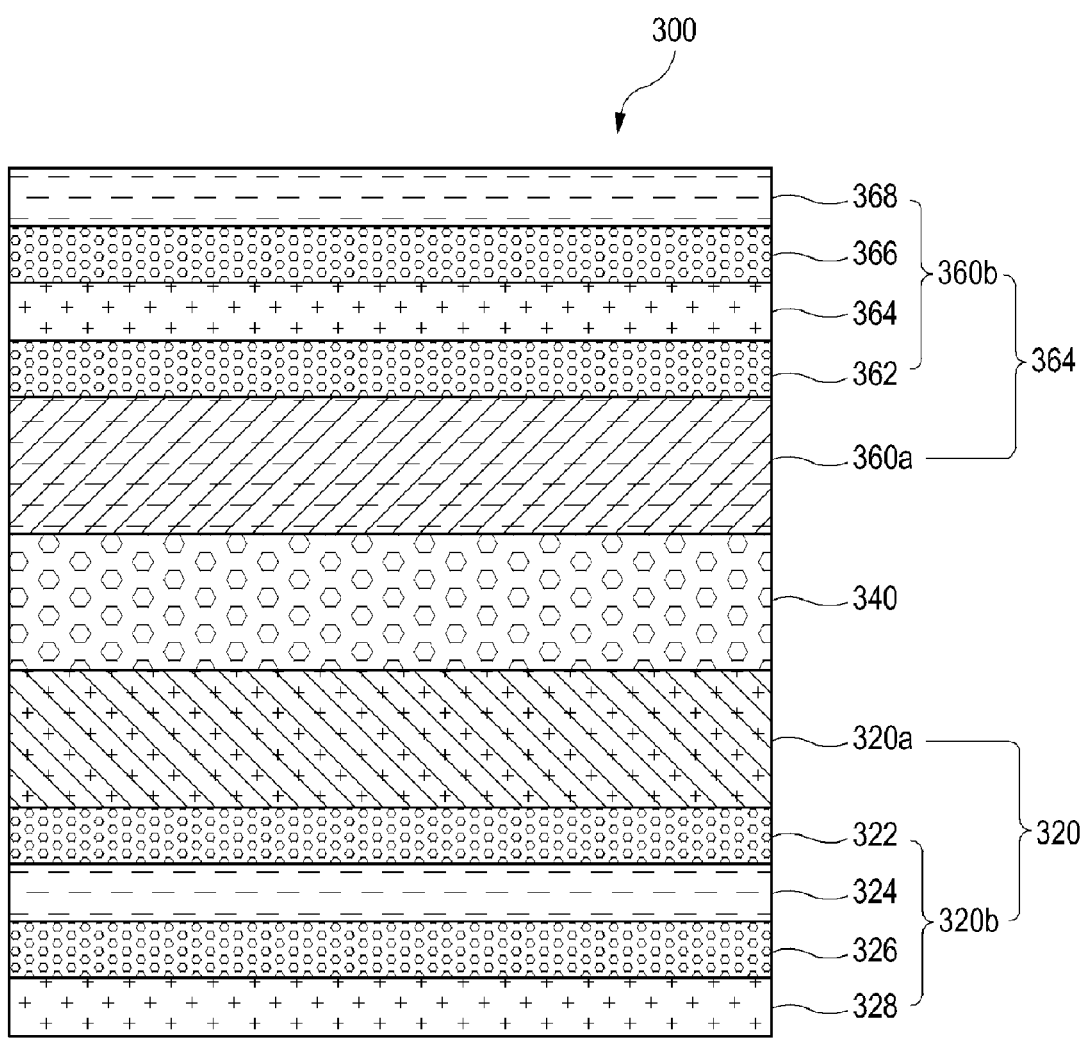
FIG. 3 is a schematic diagram showing an illustrative embodiment of an optoelectronic device.

FIG. 3 shows an illustrative embodiment of an optoelectronic device 300. As depicted, the optoelectronic device 300 may have a laminated structure in which a first conductivity type cladding layer 320, an active layer 340, a second conductivity type cladding layer 360 are sequentially stacked. Although not shown, the optoelectronic device 300 may further include a substrate, a buffer layer, and/or electrodes, as illustrated in FIG. 1.

The active layer 340 may include a nitride based semiconductor. The nitride based semiconductor may include indium, gallium, and nitrogen or any other materials exhibiting the full-solar-spectrum characteristics and have a composition represented as $In_xGa_{1-x}N$ ($x \leq 1$). The indium concentration, x, in $In_xGa_{1-x}N$ may be changed depending on the usage of the optoelectronic device 300, e.g., a LED, a LD, etc. For example, x may be in the range of $0.34 \leq x \leq 0.47$ for a visible blue light emission application or $0 \leq x \leq 0.19$ for an ultraviolet light emission application. In general, x may be in the range of $0 \leq x \leq 0.3$ for a light emitting device.

As illustrated in FIG. 3, the first conductivity type cladding layer 320 may include a first barrier layer 320a and a first superlattice multilayer 320b stacked in a downward order on the active layer 340. The second conductivity type cladding layer 360 may include a second barrier layer 360a and a second superlattice multilayer 360b stacked upon the active layer 340. The first and second superlattice multilayers 320b, 360b, may have a multiple quantum well structure. FIG. 3 shows an illustrative embodiment where the first superlattice multilayer 320b includes four different sublayers 322, 324, 326, 328, stacked in a downward order upon the first barrier layer 320a, and the second superlattice multilayer 360b includes four different sublayers 362, 364, 366, 368, stacked upon the second barrier layer 360a. FIG. 3 shows an illustrative embodiment only and is not intended to be limiting in any way. Accordingly, various other embodiments are possible, for example, where the number or structure of the layers may be changed.

The first conductivity type cladding layer 320 may be doped with at least one n-type dopant selected from the group consisting of Si, Ge, and Sn. The second conductivity type cladding layer 360 may be doped with at least one p-type dopant selected from the group consisting of Zn, Mg, Ca, and Be.

The respective layers may be formed by any one of a number of suitable methods, such as e-beam evaporation, PVD, CVD, PLD, dual-type thermal evaporation, sputtering, and so on.

In certain embodiments, some of the sublayers 322, 326, 362, 366, within the first and second superlattice multilayers 320b, 360b, may include a material similar to that the active layer 340 to reduce the lattice differences between the active layer 340 and the first and second conductivity type cladding layers 320, 360. For example, the sublayers 322, 326, 362, 366, within the superlattice multilayers 320b, 360b, may include indium, gallium, and nitrogen and have a composition of $In_yGa_{1-y}N$ ($y \leq 1$), when the active layer 340 is formed of $In_xGa_{1-x}N$.

Once materials for the active layer 340 and the sublayers 322, 326, 362, 366, within the superlattice multilayers 320b, 360b, are determined, the materials for the first and second barrier layers 320a, 360a, and sublayers 324, 328, 364, 368, may be determined to serve as barrier layers. For example, when the active layer 340 is made of $In_xGa_{1-x}N$ ($x \leq 1$), the first and second barrier layers 320a, 360a, and sublayers 324, 328, 364, 368, may include GaN. The characteristics of the cladding layers 320, 360, such as the number of the sublayers 324, 328, 364, 368, and compositions thereof, the respective concentrations of the materials within the sublayer 324, 328, 364, 368, and the thickness of each sublayer 324, 328, 364, 368, etc. may be determined such that the strain and/or electric field in the active layer 340 due to lattice mismatch may be distributed over the superlattice multilayers 320b, 360b, as will be further described below.

For example, when the active layer 340 has a composition of $In_xGa_{1-x}N$ ($0 \leq x \leq 0.2$), the sublayers 322, 326, 362, 366, within the superlattice multilayers 320b, 360b, may have a composition of $In_yGa_{1-y}N$ ($0 \leq y \leq 0.3$). In this example, the indium concentration, y, in at least one of the sublayers 322, 326, 362, 366, may have a range of $x \leq y$. Increasing the indium concentration in the sublayers 322, 326, 362, 366, may be advantageous in distributing the strain and polarization field over the active layer 340. Since indium is relatively rare and costly, however, a tradeoff may be made between the performance and associated costs.

In certain embodiments, when the active layer 340 has a thickness of about 3 nm or less, the first and second barrier layers 320a, 360a, may have a thickness of about 3 nm or less and each of the sublayers 322, 324, 326, 328, 362, 364, 366, 368, within the superlattice multilayers 320a, 360a, may have a thickness of about 1.5 nm or less, or from about 0.5 nm to about 1.5 nm. The upper limit of the thickness for the cladding layers 320, 360, may be determined so that absorption of the light generated in the active layer 340 is minimized. Increasing the thickness and/or the number of the sublayers 322, 324, 326, 328, 362, 364, 366, 368, in the superlattice multilayers 320b, 360b, such as the illustrated embodiment may be advantageous in distributing the strain and/or polarization field over the active layer 340. Due to the size limit, however, a tradeoff may be made between the performance and associated size.

In order to show the strain distribution of the superlattice multilayers 320b, 360b, in the cladding layers 320, 360, the strain and the polarization field in the active layer 340 for a single quantum well structure and the superlattice multilayers 320b, 360b, were calculated. In obtaining the strain and the polarization field in the active layer 340, it is assumed that the active layer 340, the first and second barrier layers 320a, 360a, and the first and second superlattice multilayers 320b, 360b, have compositions of $In_{0.2}Ga_{0.8}N$, GaN, and $In_{0.3}Ga_{0.7}N$—GaN, respectively. It is also assumed that the thicknesses of the active layer 340 and each of the sublayers 322, 324, 326, 328, 362, 364, 366, 368, within the first and second superlattice multilayers 320b, 360b are 3 nm and 1.5 nm, respectively. The thickness of the above layers, however, may be changed as needed, depending on the application. Table 3 below shows the results of the calculation.

TABLE 3

|  | Single quantum well | Superlattice |
| --- | --- | --- |
| Strain (%) | −2.08 | −1.084 |
| Polarization field (MV/cm) | 2.98 | 1.73 |

As indicated in Table 3 above, the active layer 340 in a structure without the superlattice multilayers 320b, 360b, has a strain of −2.08% and a polarization field of 2.98 MV/cm. With the superlattice multilayers 320b, 360b, the active layer 340 has a strain of −1.084% and a polarization field of 1.73 MV/cm. The above results show that the active layer 340 has a strain reduced by about 50% and a polarization field reduced by about 40%, compared to the structure without the superlattice multilayers 320b, 360b.

As mentioned above, each of the plurality of sublayers 322, 324, 326, 328, 362, 364, 366, 368, within the superlattice multilayers 320b, 360b, may be adjusted differently and independently, in terms of thickness, materials and concentrations thereof, etc. to distribute the strain and/or piezo field over the active layer 340. Therefore, the optoelectronic device in accordance with any of the above described embodiments may have a much improved light emitting efficiency due to the increased recombination rate in the active layer.

Figure 4:
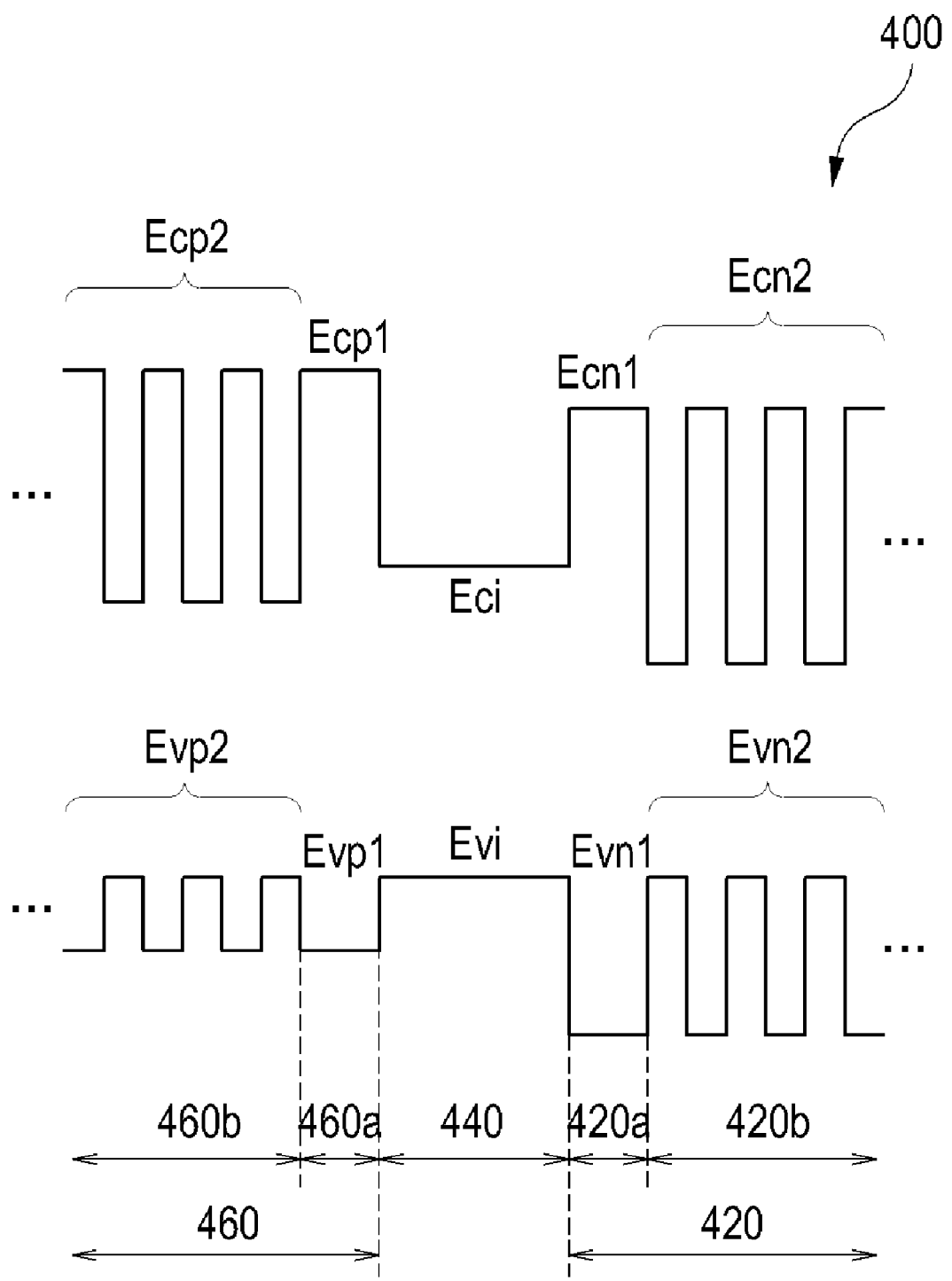
FIG. 4 is an energy band diagram for the illustrative optoelectronic device shown in FIG. 3.

FIG. 4 is an energy band diagram 400 for the illustrative optoelectronic structure shown in FIG. 3. Reference numerals 420, 440, 460 in FIG. 4 represent regions of the first conductivity type cladding layer, the active layer and the second conductivity type cladding layer, respectively. Reference numerals 420a, 420b, 460a, 460b, represent regions of the first barrier layer, the first superlattice multilayer, the second barrier layer, and the second superlattice multilayer, respectively. As illustrated in FIG. 4, the energy bands of the individual layers within the superlattice multilayer 420b, 460b, display a multiple quantum well energy band structure, where each of the individual layers may be adjusted to serve either as a quantum barrier or as a quantum well, thereby distributing the strain and/or electric field in the active layer 440 over the multiple quantum well energy band structure of the superlattice multilayers 420b, 460b. In this fashion, the strain and/or polarization field in the active layer 440 may be cancelled or reduced.

Figure 5:
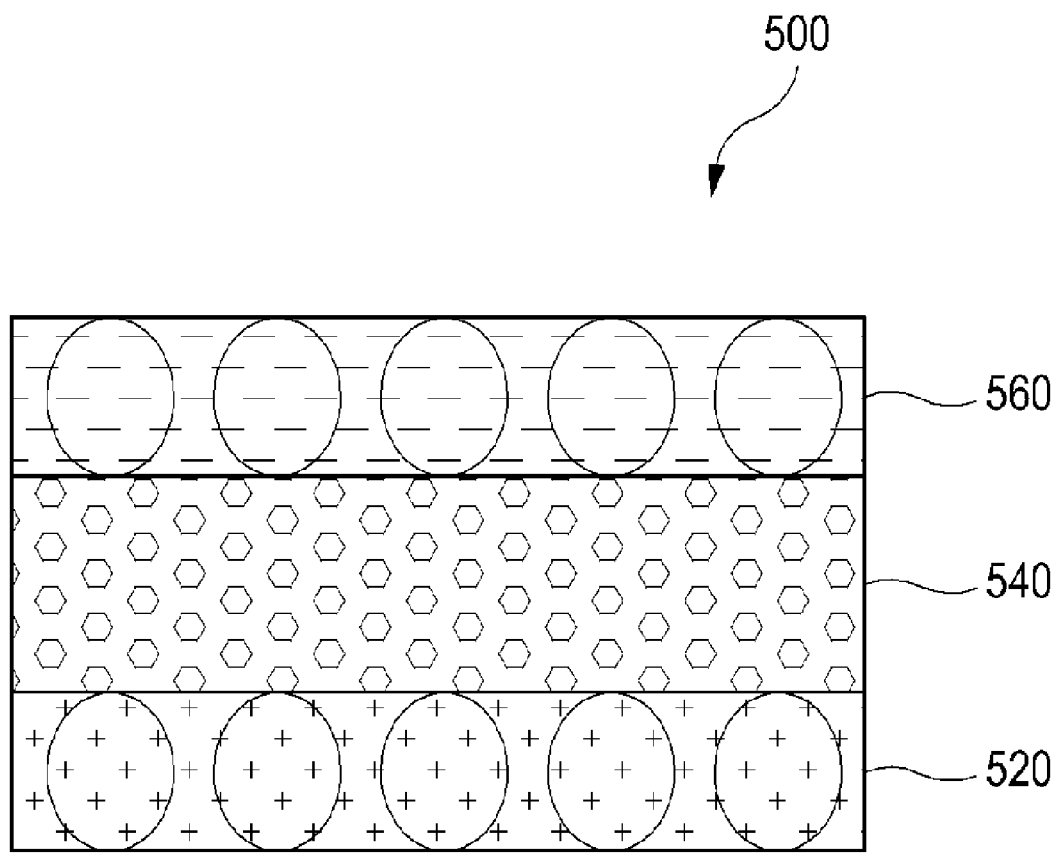
FIG. 5 is a schematic diagram showing an illustrative embodiment of an optoelectronic device.

FIG. 5 shows an illustrative embodiment of an optoelectronic device 500. As depicted, the optoelectronic device 500 may have a laminated structure in which a first conductivity type cladding layer 520, an active layer 540 and a second conductivity type cladding layer 560 are sequentially stacked. The first conductivity type cladding layer 520 and the second conductivity type cladding layer 560 may include a quaternary semiconductor. In certain embodiments, the cladding layers 520, 560, may be made of quaternary semiconductor materials similar to that of the active layer 540 to reduce the lattice differences between the active layer 540 and the cladding layers 520, 560. For example, the cladding layers 520, 560, may include a quaternary nitride semiconductor consisting of aluminum, indium, gallium, and nitrogen and have a composition of $Al_zIn_yGa_{1-y-z}N$ (y, z≦1), when the active layer 540 has a composition of $In_xGa_{1-x}N$. The characteristics of the cladding layers 520, 560, such as compositions and their respective concentrations and thickness, etc. may be determined such that the strain and/or electric (polarization) field in the active layer 540 due to the lattice mismatch may be cancelled or reduced, as will be further described below. Although not shown, the optoelectronic device 500 may further include a substrate, a buffer layer, and/or electrodes, as illustrated in FIG. 1.

The first conductivity type cladding layer 520 may be doped with at least one n-type dopant selected from the group of Si, Ge, and Sn. The second conductivity type cladding layer 560 may be doped with at least one p-type dopant selected from the group of Zn, Mg, Ca, and Be.

The active layer 540 may include a nitride based semiconductor. The nitride based semiconductor may include indium, gallium, and nitrogen or any other materials exhibiting the full-solar-spectrum characteristics and have a composition of $In_xGa_{1-x}N$ (x≦1). The indium concentration, x, in $In_xGa_{1-x}N$ may be changed depending on the usage of the optoelectronic device 500, e.g., a LED, a LD, etc. For example, x may be in the range of 0.34≦x≦0.47 for a visible blue light emission application or 0≦x≦0.19 for an ultraviolet light emission application. In general, x may be in the range of 0≦x≦0.3 for a light emitting device.

The respective layers may be formed by any one of a number of suitable methods such as e-beam evaporation, PVD, CVD, PLD, dual-type thermal evaporation, sputtering, and so on.

Figure 6:
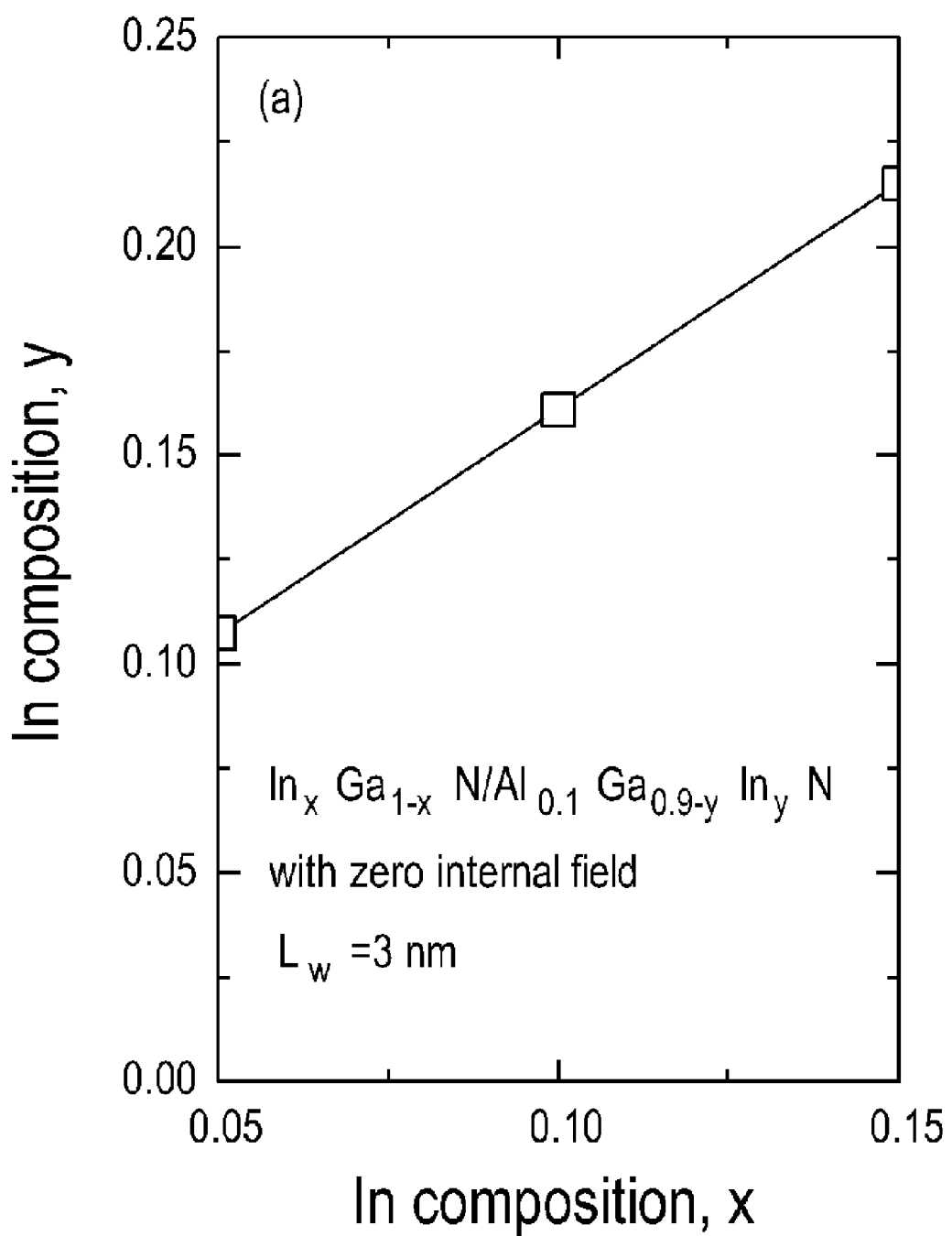
FIG. 6 shows an illustrative embodiment of a relationship between indium concentrations in the active layer and the cladding layers.

The indium concentration, y, in the cladding layers 520, 560, having a composition of $Al_zIn_yGa_{1-y}N$ that cancels the strain (i.e., no internal field) in the active layer 540 having a composition of $In_xGa_{1-x}N$ (0.05≦x≦0.15) is calculated. In obtaining the indium concentration y in the cladding layers 520, 560, depending on the indium concentration x in the active layer 540, it is assumed that the aluminum concentration z in the cladding layers 520, 560, is 0.3. FIG. 6 shows an exemplary relationship between indium concentrations in the active layer 540 and the cladding layers 520, 560, in accordance with any of the above described embodiments.

As illustrated in FIG. 6, as the indium concentration x of the active layer 540 increases from about 0.05 to about 0.15, the indium concentration y of the cladding layers 520, 560, may increase from about 0.10 to about 0.2. As shown in FIG. 6, the indium concentration of the cladding layers 520, 560, may be increased, along with an increase in the indium concentration of the active layer 540 to cancel the internal field in the active layer 540. For example, when the indium concentration x of the active layer 540 has a range of 0≦x≦0.3, the indium concentration y of the cladding layers 520, 560, may have a range of 0≦y≦0.3, and x and y have a relation of x≦y.

FIG. 6 provides only an illustrative example, where the indium concentration in the cladding layers 520, 560, varies depending on the indium concentration in the active layer 540, and is not intended to be limiting in any way. Various other embodiments are possible, where the aluminum concentration z in the cladding layers 520, 560, may be changed. The lattice constant of indium is larger than that of aluminum, and thus the indium concentration has a larger effect on the lattice constant of the cladding layers 520, 560, than does the aluminum concentration. In certain embodiments, in light of the foregoing, the indium concentration y may be adjusted first and then the aluminum concentration z may be adjusted. Further, other characteristics in the cladding layers 520, 560, such as thickness of the layer, may also be determined such that the strain and/or polarization field in the active layer 540 may be cancelled or reduced.

As mentioned above, each element of the quaternary semiconductor in the cladding layers 520, 560, may be adjusted in terms of compositions, concentrations, etc. Therefore, the illustrative optoelectronic device in accordance with any of the above described embodiments may have an improved light emitting efficiency due to an increased recombination rate in the active layer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A device comprising:
a first conductivity type cladding layer including a first barrier layer made of a nitride semiconductor having a composition of $In_yGa_{1-y}N$, wherein $0 \leq y \leq 0.3$;
an active layer formed on the first conductivity type cladding layer, the active layer including a well layer made of a nitride semiconductor, wherein the well layer is made of a nitride semiconductor having a composition of $In_xGa_{1-x}N$, where $0 \leq x \leq 0.3$ or $0.34 \leq x \leq 0.47$; and
a second conductivity type cladding layer formed on the active layer and including a second barrier layer made of a nitride semiconductor having a composition of $In_yGa_{1-y}N$, wherein $0 \leq y \leq 0.3$,
wherein the active layer is positioned between and adjacent to the first barrier layer and the second barrier layer; and
wherein the first barrier layer and the second barrier layer are configured to cancel or reduce the strain and/or piezo field in the active layer.

2. The device of claim 1, wherein the nitride semiconductor in the well layer includes indium, gallium, and nitrogen.

3. The device of claim 1, wherein at least one of the first and second barrier layers has a thickness of about 6 nm or less, and the active layer has a thickness of about 3 nm or less.

4. The device of claim 1 further comprising:
a substrate adjoining the first conductivity type cladding layer.

5. The device of claim 4, wherein the substrate is joined to the first conductivity type cladding layer through a buffer layer.

6. The device of claim 1, wherein at least one of the first and second barrier layers display a step shaped energy band.

7. The device of claim 1, wherein the well layer includes indium.

8. The device of claim 1, wherein the first and second barrier layers are about 6 nm or less.

9. The device of claim 1, wherein the active layer is about 3 nm or less.

10. The device of claim 1, wherein x is in the range of $0 \leq x \leq 0.19$.

11. The device of claim 4, wherein the substrate is gallium nitride (GaN), silicon carbide (SiC), silicon (Si) or gallium arsenide (GaAs).

* * * * *